United States Patent [19]
Lei et al.

[11] Patent Number: 5,476,548
[45] Date of Patent: Dec. 19, 1995

[54] REDUCING BACKSIDE DEPOSITION IN A SUBSTRATE PROCESSING APPARATUS THROUGH THE USE OF A SHADOW RING

[75] Inventors: Lawrence C. Lei, Milpitas; Cissy S. Leung, Fremont; Eric A. Englhardt; Ashok K. Sinha, both of Palo Alto, all of Calif.

[73] Assignee: Applied Materials, Inc., Santa Clara, Calif.

[21] Appl. No.: 263,617

[22] Filed: Jun. 20, 1994

[51] Int. Cl.⁶ .......................... C23C 16/00; B05L 13/00; H01L 21/00
[52] U.S. Cl. .......................... 118/728; 118/729; 118/500; 118/503; 427/248.1; 437/225
[58] Field of Search ....................... 118/730, 725, 118/721, 728, 729, 500, 503; 427/248.1; 437/225

[56] References Cited

U.S. PATENT DOCUMENTS

| | | | |
|---|---|---|---|
| 5,230,741 | 7/1993 | van de Ven | 118/728 |
| 5,238,499 | 8/1993 | van de Ven et al. | 118/724 |
| 5,262,029 | 11/1993 | Erskine | 204/298.15 |
| 5,292,554 | 3/1994 | Sinha | 427/251 |
| 5,326,725 | 7/1994 | Shertinsky | 437/225 |
| 5,328,722 | 7/1994 | Ghanayem | 427/250 |

*Primary Examiner*—Robert Kunemund
*Assistant Examiner*—Jeffrie R. Lund
*Attorney, Agent, or Firm*—Craig P. Opperman; Charles S. Guenzer

[57] ABSTRACT

A substrate processing apparatus for processing a substrate having a peripheral edge, an upper surface for processing and a lower surface lying on a support. The apparatus includes a processing chamber which houses the substrate support, in the form of a heater pedestal including a substrate receiving surface for receiving the lower surface of the substrate. A circumscribing shadow ring is located around the pedestal to cover peripheral edge portion of the substrate. The shadow ring also defines a cavity, between itself and the pedestal, at the peripheral edge of the substrate. In operation, the chamber receives processing gas at a first pressure and purge gas is introduced into the cavity, between the ring and the pedestal, at a second pressure which is greater than the first pressure. Fluid conduits are provided to enhance the flow of the purge gas away from the peripheral edge of the substrate.

26 Claims, 4 Drawing Sheets

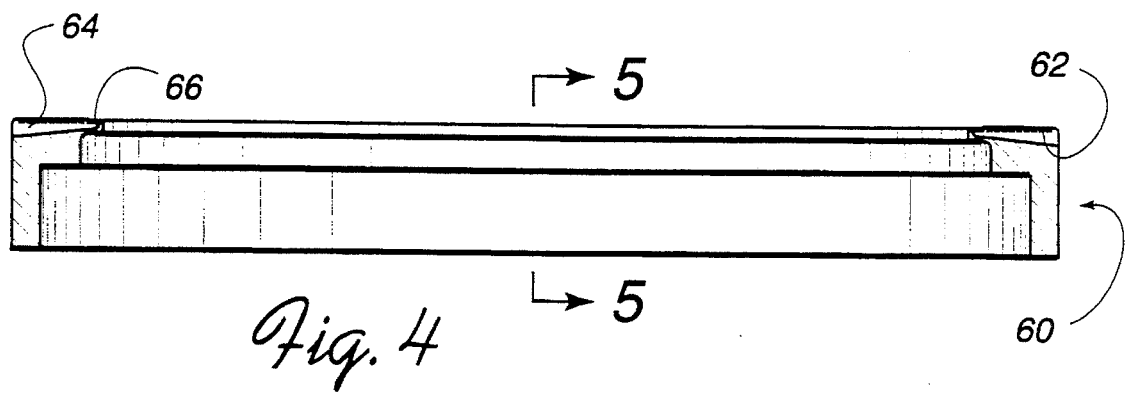
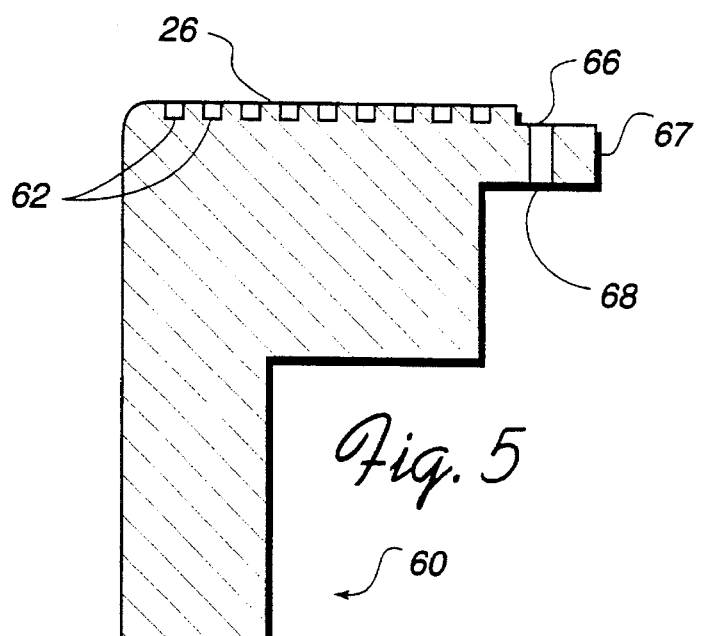
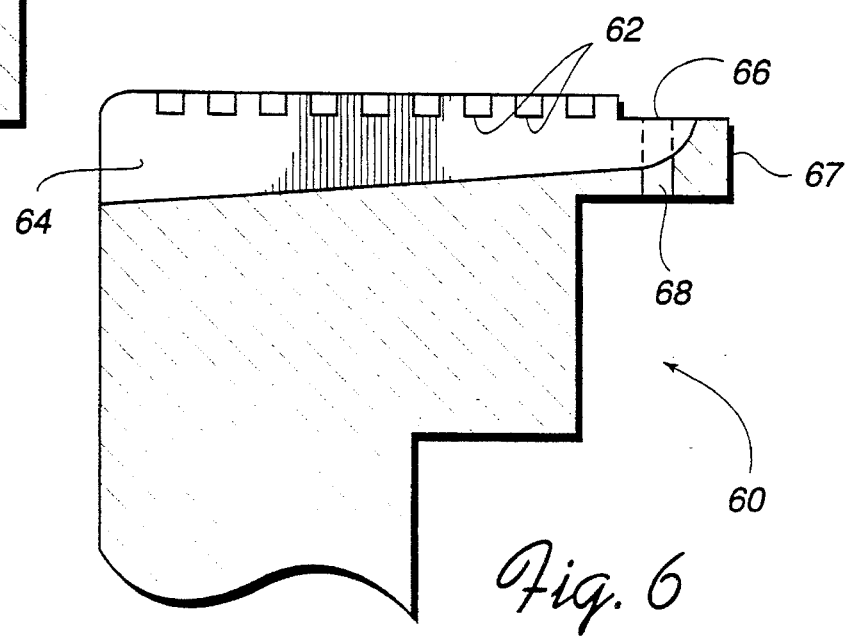

REDUCING BACKSIDE DEPOSITION IN A SUBSTRATE PROCESSING APPARATUS THROUGH THE USE OF A SHADOW RING

BACKGROUND OF THE INVENTION

1. Field of the Invention

This invention relates to apparatus for depositing layers of material on semiconductor substrates and, more particularly, to reducing the deposition of such material on the backside of the substrate.

2. Background

A layer of a material can be deposited on a substrate, such as a semiconductor wafer, using a chemical vapor deposition (CVD) or physical vapor deposition (PVD) process. An example of one such process is the deposition of tungsten on a silicon semiconductor wafer using a CVD process.

Prior to commencing the Tungsten CVD process, the wafer is loaded into a deposition chamber where it is mounted horizontally on a support, such as a susceptor, with a deposition surface facing upwards. Before being loaded into the chamber the upper deposition surface of the wafer is coated with a titanium nitride film. This is because tungsten does not readily adhere to the usual silicon dioxide ($SiO_2$) surface of the wafer. It does, however, adhere to titanium nitride.

Once the coated wafer is loaded into the chamber, the deposition gas, usually tungsten fluoride ($WF_6$), is introduced into the chamber via a gas inlet or "shower head" mounted above the wafer. Typically, the major part of the deposition process is carried out at elevated temperatures of between 250° C. and 600° C. and at sub-ambient pressures of 10.7 to 12 kPa (80 to 90 Torr).

In Tungsten CVD and other substrate processing operations, a primary goal is to obtain as many useful die as possible from each substrate. Many factors influence the ultimate yield of die from each substrate processed in these processing operations. These factors include the amount of contaminants that can attach to the substrate and contaminate its surface. Other factors include the processing variables which affect the uniformity and thickness of the layer of material deposited on the substrate of the substrate. Both of these and other factors must be carefully controlled in CVD and other processes to maximize the die yield from each substrate.

Unfortunately, CVD processing chambers include multiple sources of particle contaminants which, if received on the surface of the substrate, reduce its die yield. One source of particle contamination in CVD processing is the deposition of material on the edge and back/underside of the wafer. For a number of reasons, the deposition material layer does not firmly attach itself to the edge or back-/underside of the substrate and so the material layer deposited in these locations are known to flake off and become a particle contaminant both in the CVD and subsequent processing operations. This is particularly so in the tungsten CVD process if, as may be the case, titanium nitride has not been deposited on the edge and backside of the wafer. As described above, this means that the tungsten will not adhere firmly to these areas and will relatively easily flake off.

One method of controlling this unwanted edge and backside deposition is to use a shadow ring to reduce the occurrence of the deposition layer in these areas. A shadow ring is a masking member which usually rests on the substrate and covers its upper, outer, circumferential area. This limits access of the deposition gas to the contacted area of the substrate. As the shadow ring limits passage of process gas across the contacted circumferential area, it also limits access of the gas to the edge and backside of the substrate. The shadow ring, however, has not proven universally successful, due to wafer warpage and the volatile deposition gas still tends to migrate under the lip of the shadow ring and deposit unwanted material on the substrate edge and backside.

Apart from the existence of contaminants from sources such as unwanted deposition, processing variables also affect the die yield. One such processing variable (which affects the uniformity of the deposition material layer) is the uniformity of heating of the wafer.

In many prior art processing chambers the wafer is heated from below by means of heater lamps. These heater lamps heat, by means of infrared radiation, a susceptor on which the substrate is supported within the chamber. The susceptor in turn heats the substrate by conduction. One of the problems with this arrangement is that the susceptor (typically made of 8 millimeters thick aluminum with a ceramic support plate) has a relatively short lifespan. This means that it must be replaced, often as frequently as after 3,000 cycles, which results in increased labor costs and expensive downtime.

One alternative arrangement is to replace the heater lamps and thin susceptor with a heater pedestal for both supporting and heating the wafer. An example of this type of arrangement is described in copending U.S. patent applications 08/200,079 in the name of Lei, et al., and 08/200,862 in the name of Sinha, et al, both filed on Feb. 23, 1994 and assigned to Applied Materials, Inc. of Santa Clara, Calif. In this arrangement, the wafer is supported on a flat supporting surface of a heater pedestal mounted on a vertical stalk within the chamber. The pedestal is heated from within by means of a heating coil, and the wafer, in turn, is heated by the hot supporting pedestal. In order to provide for improved uniformity of heating of the wafer, this arrangement makes provision for drawing a "vacuum" at the interface between the underside of this wafer and the flat supporting surface of the pedestal. The resulting pressure differential across the wafer draws the wafer onto the pedestal resulting in improved uniformity of heating of the wafer.

As a result of this vacuum drawn at the backside of the wafer, however, processing gas can be drawn around the edge of the wafer and into the interface between the wafer and the pedestal. This can occur even in the presence of a shadow ring and results in unwanted edge and backside deposition even when a shadow ring is located over the wafer. As explained earlier, this unwanted deposition can lead to the generation of particle contaminants. Accordingly, the improved uniformity of heating is accompanied by the possible increase of unwanted edge and backside deposition.

The need exists, therefore, for an improved chemical deposition apparatus which more uniformly heats a substrate and, at the same time, deposits less material on the edge and backside of the substrate.

SUMMARY OF THE INVENTION

Briefly, the invention is a substrate processing apparatus for processing a substrate having a peripheral edge, an upper surface for processing and a lower surface lying on a support. The apparatus includes a processing chamber which houses the substrate support, in the form of a heater pedestal including a substrate receiving surface for receiving the lower surface of the substrate. A circumscribing shadow ring is located around the pedestal to cover peripheral edge portion of the substrate. The shadow ring also defines a cavity, between itself and the pedestal, at the peripheral edge of the substrate.

In operation, the chamber receives processing gas at a first pressure and purge gas is introduced into the cavity, between the ring and the pedestal, at a second pressure which is greater than the first pressure. Fluid conduits are provided to enhance the flow of the purge gas away from the peripheral edge of the substrate. In a preferred embodiment, these fluid conduits are channels formed in the body of the pedestal at the interface between the pedestal and the ring.

It has been found that the introduction and resulting flow of the purge gas reduces unwanted deposition on the peripheral edge and lower surface of the substrate.

The apparatus can also include a gas port opening at the receiving surface of the pedestal. During processing the pressure at the gas port is reduced to a third pressure which is less than the first pressure, which is the typical chamber pressure. This causes a substrate, received on the receiving surface, to be held down firmly onto the pedestal by the pressure differential between the first and third pressures.

The shadow ring typically defines a substrate receiving seat which includes a lip formation which, in use, covers a peripheral edge of the upper surface of the substrate. During processing, the substrate is received into this seat with the shadow ring being supported by the substrate. As a result, the lip contacts the surface of the substrate, and thereby provides an exclusionary zone on the surface of the substrate where no material deposition occurs during processing.

When no substrate is present in the chamber the shadow ring is supported, at least in part, by the pedestal. At the interface between the pedestal and the ring, the surface of the pedestal is made uneven by circumscribing concentric grooves. These grooves could also be formed in the shadow ring and function to reduce the contact area between the pedestal and the ring. This in turn, reduces sticking between the shadow ring and the pedestal and facilitates radial movement between the shadow ring and the pedestal.

The pedestal preferably includes a heater for heating the support whereby a substrate supported thereon is heated by means of conduction.

This invention finds particular application in, but is not limited to, semiconductor wafer processing chambers which process such wafers using a tungsten CVD process.

A primary advantage of this invention is that it reduces the occurrence of deposition on the edge and backside of the substrate.

Another advantage of this invention is that it provides for the uniform heating of a substrate supported on the pedestal.

Yet another advantage of the invention is that the heated pedestal has a longer life than prior art thin susceptors.

These advantages and further details of the present invention will no doubt become apparent to those skilled in the art after having read the following detailed description of the invention which is illustrated in the drawings.

DESCRIPTION OF THE DRAWINGS

In the accompanying drawings:

FIG. 4 is a cross sectional detail of the pedestal circumscribing ring according to the invention;

FIG. 5 is a cross-section along line 5—5 in FIG. 4; and

FIG. 6 is an enlarged detailed cross-section along line 6—6 in FIG. 2 of the encircled portion of the edge of the circumscribing ring shown in FIG. 4.

DESCRIPTION OF THE INVENTION

Figure 1:
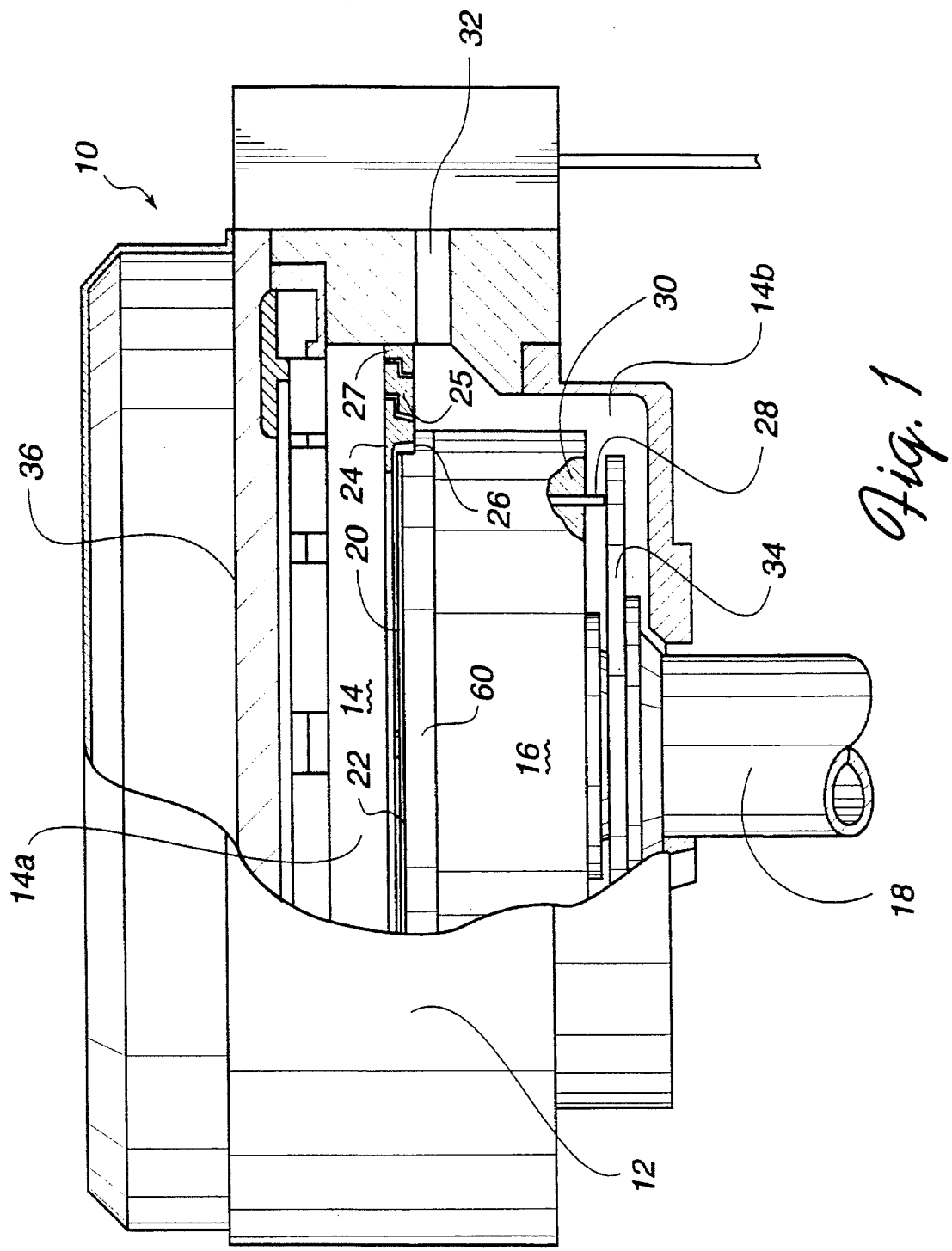
FIG. 1 is a partial cross-section through the upper portion of a semiconductor processing apparatus illustrating this invention.

The general application of this invention is illustrated, by way of a non-limiting example with reference to FIG. 1, for a typical metal CVD processing apparatus 10. The apparatus 10 is shown to include an outer body 12 which defines a processing chamber 14 therein. The processing chamber 14 houses a substrate support in the form of an aluminum heater pedestal 16 mounted on a generally vertically oriented stalk 18. The heater pedestal 16 serves to support a semiconductor wafer 20 on its upper supporting face 22.

The wafer 20 is surrounded by a substrate circumscribing shadow ring 24. Around the outer perimeter of the shadow ring 24, an outer support ring 25 is disposed. This outer ring 25 is supported on a conventional pumping plate 27 which, together with the two rings, 24 and 25, divide the chamber 14 into an upper and lower sections, 14a and 14b respectively.

During processing, the pedestal 16 moves upwards, forcing the wafer 20 up against the shadow ring 24 to lift it upwards to "hang" from and be supported by the wafer 20. When processing is not occurring (the "idle" state), the pedestal is in a lowered position and the shadow ring 24 is supported by the outer shadow ring 25 and by a step formation 26 formed in a substrate support circumscribing ring in the form of a corner ring 60 attached by welding to the main pedestal 16 at its outer edge.

When so supported, the pedestal 16, which remains heated, heats the shadow ring 24 by conduction. This improves the through put of the reactor as no delays occur to heat the shadow ring before commencing processing.

The outer ring 25 is, however, not heated by the pedestal and remains generally cooler than the shadow ring 24. To prevent the loss of heat from the shadow ring 24 to the cooler outer support ring 25, the shadow ring 24 rests on six pads (not shown) on the outer ring 25. As a result, the shadow ring 24 loses very little heat at its outer edge to the outer ring 25 and no significant thermal gradient occurs across the shadow ring 24. A significant thermal gradient could cause the shadow ring to crack under thermal stress. In a similar fashion the outer support ring 25 rests on six supporting pads (also not shown) on the pumping plate 27. As a result of this arrangement, a small gap exists between both the pumping plate 27 and the outer ring 25, and the outer ring 25 and the shadow ring 24. These gaps are found both during processing and the "idle" state of the chamber. To prevent the migration of deposition gas through these gap, purge gas, usually nitrogen or argon is introduced into the lower half 14b of the chamber. This gas is introduced at a flow rate of between 500 milliliters and 2 liters per minute to flow through these gaps, effectively preventing deposition gas from moving into the lower half 14b of the chamber.

FIG. 1 also illustrates a wafer lift finger 28 received in an aperture 30 passing through the body of the pedestal 16. Typically, the apparatus 10 would include four such lift fingers. These lift fingers 28 operate to lift the wafer 20 clear of the upper face 22 of the pedestal 16 so that the wafer can be removed from the chamber 14 after processing. This removal of the wafer is achieved by means of a conventional processing apparatus robot arm (not shown) which enters the chamber through a port 32 that is selectively opened through a slit valve. The same robot arm is also used to insert wafers into the chamber 14. The lift fingers 28 are moveable vertically under action of a lifting mechanism 34 of which only the upper portion is shown.

During processing, the heater pedestal 16 is heated from within (to a temperature of about 300° to 500° C., and typically 450° C.) by means of electrically powered heater elements, the details of which will be described further below. The heater pedestal 16, in turn, heats the wafer 20 by means of conduction. When the wafer reaches a suitable temperature (preferably about 450° C.), processing gas is injected into the chamber 14 through a shower head 36 located above and over the wafer 20. The details of the shower head and how the processing gas (typically tungsten fluoride in a tungsten CVD process) are injected into the chamber are known in the art and do not form part of this invention.

Figure 2:
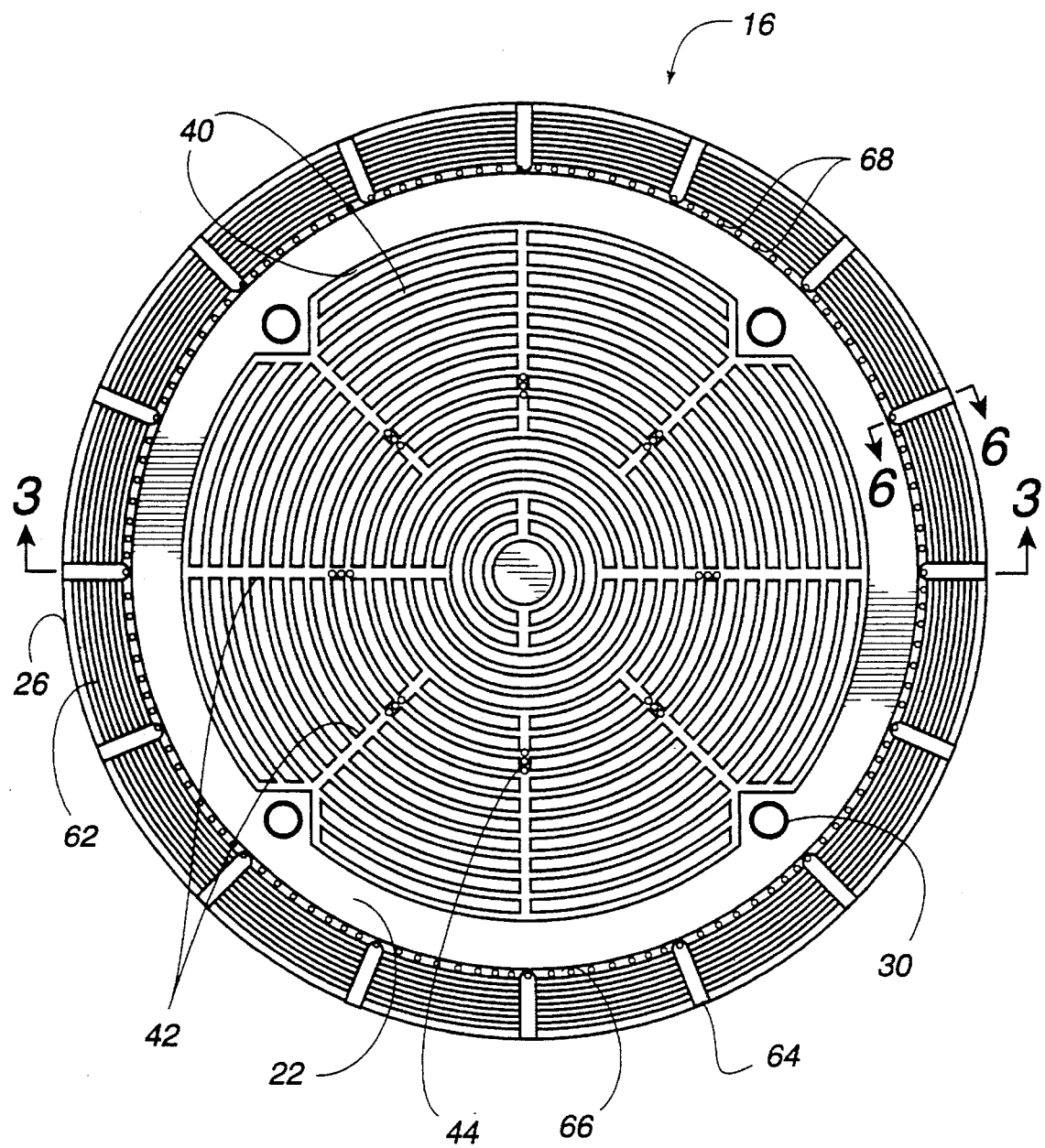
FIG. 2 is a plan view of the heater pedestal of the invention.
Figure 3:
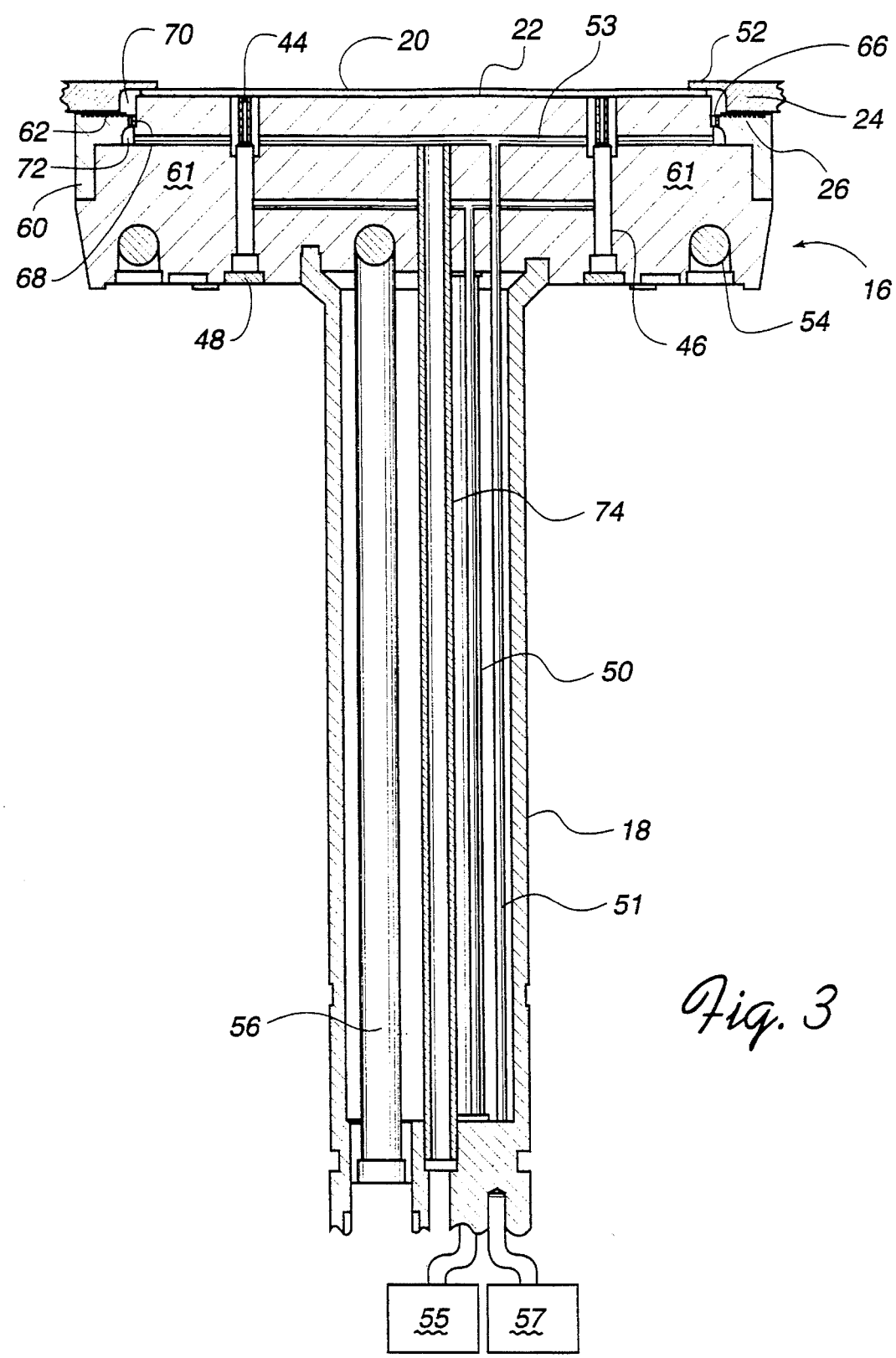
FIG. 3 is a cross-section along line 3—3 in FIG. 2.

Turning now to FIGS. 2 and 3, the heater pedestal 16 will be described in greater detail. As shown in FIG. 1, the pedestal 16 includes a flat, upper, wafer supporting face 22, a step formation 26 formed in a corner ring 60 and four finger apertures 30. As previously described, these apertures 30 house the lift fingers 28, one of which is illustrated in FIG. 1.

As illustrated in FIG. 2, the pedestal 16 has a plurality of concentric circular grooves 40 formed in its upper supporting face 22. These concentric grooves 40 are typically 0.21 mm (0.08 inches) wide and 0.38 mm (0.015 inches) deep and 2.97 mm (0.117 inches) apart. They are interconnected by means of radially oriented channels 42. In the outer end of each radial channel 42 a plurality of vacuum ports 44 are formed into the body of the pedestal. As illustrated in FIG. 3, these vacuum ports 44 are in communication with a circular manifold groove 46 formed into the underside of the main pedestal body 61. This groove 46 is sealed at the underside of the pedestal by means of a plug 48. The groove 46 is also in communication with a vacuum conduit 50 located within the stalk 18. The conduit 50 communicates with the groove 46 by means of at least one generally horizontal conduit (not shown) within the main body 61 of pedestal 16. Vacuum is supplied by a vacuum supply 55 which is in communication with the conduit 50.

During processing, a semiconductor wafer 20 rests on the upper surface 22 as shown in FIG. 3. As described above, the shadow ring is lifted slightly upwards by the wafer 20 under action of the pedestal 16. At this time, the outer portion of the wafer bears upwardly against and is covered by an overhanging lip 52 of the shadow ring 24. This results in the shadow ring being lifted clear of the step formation 26 so that a gap of about 0.13 mm (0.005 inches) to 0.38 mm (0.015 inches) exists between the underside of the shadow ring and the top of the step formation 26. This gap must be kept as small as possible so that the pedestal can continually heat the shadow ring 24.

The typical deposition process has two discrete deposition steps. During the first step, lasting about thirty (30) seconds, the pressure in the chamber is reduced to about 0.6 kPa (4.5 Torr) and tungsten fluoride introduced into the chamber. This step, known as a nucleation step, results in a very thin layer of tungsten being deposited on the wafer. This thin layer serves as a base layer onto which further layers of tungsten are deposited.

During the second deposition step (lasting less than 60 seconds and during which most of the tungsten is deposited), a "vacuum" is drawn at the interface between the wafer 20 and the upper face 22 of the pedestal 16. This is achieved by drawing a vacuum to about 2.7 kPa (20, Torr) through the vacuum ports 44 via the conduit 50 and the grooves 46. The drawing of this vacuum results in a pressure of about 2.7 kPa in all the concentric grooves 40. As the interior pressure of the chamber during processing is approximately 10.7 to 12 kPa (80 to 90 Torr), a pressure differential exists across the wafer 20. This causes the wafer 20 to be drawn against the upper face 22 of the pedestal 16. The advantage of this tight contact is that heat from the pedestal is more uniformly transmitted from the pedestal to the wafer. This leads to a uniform heating of the wafer and, therefore, improved deposition of tungsten on the wafer surface.

The pedestal 16 is, in turn, resistively heated by means of an electrically powered heating coil 54 mounted within the body of the pedestal 16. The coil 54 is supplied with electrical power along a rigid, stainless steel connecting stem 56 located within the body of the stalk 18. Although only one coil is shown in this figure, more than one coil could be used or even multiple heating elements which are nested together but powered separately.

As has been described previously, the shadow ring 24 operates to provide an exclusionary zone, where no deposition occurs, at the edge of the wafer. For typical CVD processing operations the step formation is about 3.81 mm (0.15 inches) high, the shadow ring about 5.08 mm (0.2 inches) thick, and the overhanging portion about 0.89 mm (0.035 inches) thick. The overhanging portion typically defines an exclusionary zone of about 3 to 5 mm (0.12 to 0.20 inches) about the edge of the wafer 20.

The details of the corner ring 60 are illustrated further in FIGS. 4 to 6. These figures should be viewed in conjunction with FIGS. 2 and 3. All these figures show that the corner ring 60 has a plurality of concentric grooves 62 formed therein. These grooves are typically equally spaced and 2.54 mm (0.10 inches) deep 2.54 mm (0.10 inches) wide. The grooves 62 are provided so that the shadow ring 24 does not stick to the upper surface of the corner ring 60. Sticking is prevented because the grooves reduce the contact area between the shadow ring and the corner ring 60. It is important that the shadow ring does not stick to the corner ring as these two components have different coefficients of thermal expansion and both components must, therefore, be able to move relative to one another.

The corner ring 60 is shown to also include 16 radially extending channels 64. These channels are typically about 3 mm (0.117 inches) wide and, as illustrated in FIG. 6, taper at about 5°, from about 1.52 mm (0.06 inches) deep, downwards towards the outer edge of the pedestal. The channels 64 open, at the outer edge of the pedestal 16, into the lower portion 14b of the chamber 14, shown in FIG. 1, and towards the inner portion of the pedestal, into a keyed formation 66 formed along an inner edge 67 of the corner ring 60. This keyed formation is approximately the same depth as the grooves 62 and is about 2.5 mm (0.1 inches) wide.

In the floor of the keyed formation 66 a plurality of small, typically 0.76 mm (0.03 inches) in diameter, gas ports 68 is formed. As can be seen, particularly from FIG. 3, the gas ports 68 open upwards to an upper circumferential cavity 70 extending just beyond the outer edge of the wafer 20 and defined between the shadow ring 24, the main pedestal body 61 and the corner ring 60. The ports 68 open downwards into a lower circumferential cavity 72 defined between the corner ring 60 and the main pedestal body 61. The lower cavity 72 and, thereby, the upper cavity 70 are supplied with purge gas from a purge gas supply 57 via a conduit 51 extending up the center of the stalk 18 of the pedestal 16. From this conduit 51, eight conduits 53 extend radially and generally horizontally from the top of the conduit 50 across to the cavity 72. Also shown, in this figure, is a central conduit 74 which houses a thermocouple (not shown) for measuring the temperature of the pedestal during processing.

During the second deposition step, the inert purge gas, typically argon, is supplied at a flow rate of approximately two liters per second from a source (not shown) at approximately 207 kPa (30 p.s.i.) and flows through a flow control device (such as a mass flow controller). This control device causes the pressure in the purge gas to drop by about 25% to 33%. Additional pressure drops occur in the gas as it moves towards and into the cavities 72 and 70. Nonetheless, the pressure of the purge gas is still great enough in the upper cavity 70 to substantially prevent process gas from migrating into this cavity. From this cavity 70, the purge gas flows out into the lower portion 14b of the chamber 14 via the radially extending channels 64. Once the purge gas has flowed out, it enters the lower portion 14b of the chamber 14 to be exhausted through standard exhausts in the chamber. If supplied at all, the purge gas is supplied during the first deposition step at approximately 250 milliliters per second.

The supply of this purge gas has a particularly advantageous effect in that it substantially reduces or eliminates deposition of tungsten on the edge and outer portion of the underside of the wafer 20. It is speculated that this reduction results from two factors. Firstly, the purge gas, while in the upper cavity 70, is at a pressure higher than the chamber's ambient pressure. As a result, gaseous tungsten fluoride is prevented from seeping underneath the lip 52 of the shadow ring 24. Secondly, even if such seepage does occur, the tungsten fluoride gas is removed from the chamber 70 by the flow of the purge gas. This occurs because the purge gas flows out continually and at high mass flow rates along the radial channels 64 formed in the circumscribing ring 60.

As has been previously indicated, the gap between the shadow ring 24 and the step formation 26 must be kept as small as possible so that the pedestal can transfer as much heat as possible to the shadow ring. This small gap is, however, not sufficiently large to allow for sufficient flow of purge gas through the chamber 70. Also, it has been found that if the channels 64 are absent, the purge gas lifts the shadow ring 24 from the surface of the wafer. This is detrimental to the masking effect of the shadow ring and could lead to a non-uniform or inconsistent exclusionary zone around the edge of the wafer. Such deposition does, however, not occur when the channels 64 are present as the purge gas flows out along the channels. These channels, therefore, function to both maintain the pressure in the chamber at a level low enough so that the shadow ring does not lift, and allow the purge gas to flow freely out of the chamber to remove any deposition gas that has seeped below the shadow ring.

Although the present invention has been described above in terms of a specific embodiment (that of an apparatus for use in a tungsten CVD process), it is anticipated that alterations and modifications thereof will no doubt become apparent to those skilled in the art. For example, the radially extending channels 64 are but one type of fluid conduit that could be appropriate. Such conduits should be sized and positioned to transfer sufficient flow of purge gas while at the same time allow close thermal contact between the shadow ring 24 and the pedestal 16. The channels 64 could, for instance, be replaced by conduits leading through the main pedestal, corner ring, or shadow ring or by radial grooves in the bottom of the shadow ring 24. In addition, the step formation 26, concentric grooves 62 and the channels 64 could be formed in a unitary pedestal body and not in a separate corner ring 60. Further, the specific details described are for the processing of 150 mm and 200 mm (6 and 8 inch) diameter wafers. Appropriate modifications can be made for differently sized wafers. Further, the precise shape of the pedestal is not critical and it may even be domed or non-circular in plan. Similarly, the wafer need not be a semiconductor wafer nor circular in shape. It could be a substrate of another material and/or be non-circular in shape. It is therefore intended that the following claims be interpreted as covering all such alterations and modifications as fall within the true spirit and scope of the invention.

What is claimed is:

1. A substrate processing apparatus for processing a substrate having a peripheral edge, an upper surface for processing and a lower surface, the apparatus comprising:

(a) a housing defining a processing chamber at a first pressure which, in operation, receives processing gas;

(b) a substrate support within the chamber including a substrate receiving face for receiving the lower surface of the substrate;

(c) a substrate circumscribing ring circumscribing the substrate and defining a cavity, between itself and the substrate support at the edge of the substrate;

(d) a purge fluid supply path for introducing a purge fluid into the cavity at the peripheral edge of the substrate, and;

(e) at least one fluid path, separate from the purge fluid supply path, for exhausting the purge fluid from the cavity.

2. The substrate processing apparatus of claim 1 wherein the fluid path is defined by at least one fluid conduit.

3. The substrate processing apparatus of claim 2 wherein the fluid conduit comprises a channel formed in at least one of the circumscribing ring and the substrate support.

4. The substrate processing apparatus of claim 3 wherein the channel is a radially extending groove formed in the substrate support.

5. The substrate processing apparatus of claim 4 wherein the circumscribing ring has a surface abutting a surface of the substrate support and a fluid conduit is defined at the abutting surfaces of the ring and support.

6. The substrate processing apparatus of claim 5 wherein the substrate support includes at least one gas port opening at its substrate receiving face, and the apparatus further comprises a vacuum supply for reducing pressure at the gas port to a second pressure less than the first pressure, whereby a substrate received on the receiving face is held down onto the face by the pressure differential between the first and second pressures.

7. The substrate processing apparatus of claim 6 wherein the substrate support includes a heater for heating the support whereby a substrate supported thereon is heated by means of conduction.

8. The substrate processing apparatus of claim 5 wherein the circumscribing ring includes a substrate overhanging formation dimensioned to cover a peripheral edge portion of the upper surface of the wafer when it is supported by the substrate support.

9. The substrate processing apparatus of claim 8 wherein at least one of the abutting surfaces of the support and circumscribing ring has an undulating characteristic to reduce sticking between the abutting surfaces.

10. The substrate processing apparatus of claim 9 wherein the undulating characteristic is defined by a plurality of concentric grooves formed in the surface.

11. A processing reactor, comprising:
    a processing chamber receiving processing gas in an upper portion thereof for processing a substrate;
    a pedestal for supporting said substrate in said upper portion;
    a shadow ring engaging an upper periphery of said substrate and forming a cavity between itself and said pedestal in a vicinity of said periphery;
    a purge fluid supply for supplying a purge fluid to said cavity; and
    a plurality of fluid paths extending from said cavity to a lower portion of said chamber.

12. A processing reactor as recited in claim 11, wherein a gap exists between said shadow ring and at least a portion of said pedestal outwards of said periphery.

13. A processing reactor as recited in claim 12, wherein said pedestal includes a resistive heater for heating said substrate.

14. A processing reactor as recited in claim 11, wherein said fluid paths comprise radially extending grooves formed in at least one of said shadow ring and said pedestal.

15. A processing reactor as recited in claim 14, wherein said grooves are formed in said pedestal.

16. A processing reactor as recited in claim 11, wherein said fluid paths comprise closed conduits formed in said pedestal.

17. A processing reactor as recited in claim 11, wherein said pedestal includes a plurality of circumferential grooves formed in a surface thereof.

18. A processing reactor, comprising;
    a processing chamber receiving processing gas in an upper portion thereof for processing a substrate;
    a pedestal for supporting said substrate in said upper portion; and
    a ring member having a lip portion engaging an upper periphery of said substrate and a body portion extending outwardly from said lip portion and having a lower surface facing said pedestal;
    wherein a facing portion of said pedestal facing said lower surface of said body portion of said ting member is formed with a plurality of circumferential grooves.

19. A processing reactor as recited in claim 18, wherein said facing portion is separated from said lower surface of said body portion of said ring member by a gap when said lip portion of said ring member engages said upper periphery of said substrate and wherein said facing portion additionally comprises a plurality of radial grooves extending from a cavity formed between said ring member and said pedestal around an outer periphery of said substrate to a lower portion of said processing chamber.

20. A processing reactor as recited in claim 19, wherein said pedestal includes a heater for heating said substance.

21. A method of chemical vapor deposition, comprising the steps of:
    supporting a substrate on a pedestal in a chamber:
    covering an upper periphery of said substrate with a ring member extending outwardly from an outer periphery of said substrate, said ring member being placed such that a cavity is formed between said pedestal and said ring member in a vicinity of said outer periphery and a circumferential gap is formed between said ring member and said pedestal that extends radially outwardly from said cavity;
    electrically heating said pedestal whereby said substrate is heated and heat flows across said gap to said ring member;
    flowing a deposition gas into a portion of said chamber overlying said substrate;
    flowing a gas into said cavity, whereby said gas flows outwardly from said cavity through said gap; and
    additionally flowing said gas out of said cavity through paths other than said gap.

22. A method of chemical vapor deposition, comprising the steps of:
    (a) supporting a substrate on a substrate support in a chamber;
    (b) covering an upper periphery of the substrate with a substrate circumscribing ring, a cavity being defined between the substrate circumscribing ring and the substrate support, at an outer periphery of the substrate, and a gap being formed between the substrate circumscribing ring and the substrate support that extends radially outward from the cavity;
    (c) heating the substrate support whereby heat flows across the gap to the substrate circumscribing ring and the substrate is heated by the substrate support and the substrate circumscribing ring;
    (d) flowing a processing gas into the chamber;
    (e) flowing a fluid into the cavity; and
    (f) exhausting the fluid from the cavity through at least one fluid exhaust other than the gap.

23. The method of claim 22 wherein the step of exhausting the fluid from the cavity comprises the sub step of exhausting the fluid through at least one channel formed in at least one of the substrate circumscribing ring and the substrate support.

24. The method of claim 22 wherein the step of exhausting the fluid from the cavity comprises the sub step of exhausting the fluid through at least one radially extending channel formed in the substrate support.

25. The method of claim 23 further comprising the step of restricting the exhausting of the fluid from the cavity to maintain the fluid in the cavity at a second pressure greater than a first pressure within the chamber.

26. The method of claim 24 wherein the step of restricting the exhausting of the fluid includes maintaining the fluid in the cavity at a pressure such that the substrate circumscribing ring will not be lifted by the fluid in the cavity.

* * * * *